United States Patent [19]

McDonough et al.

[11] Patent Number: 4,723,226

[45] Date of Patent: Feb. 2, 1988

[54] VIDEO DISPLAY SYSTEM USING SERIAL/PARALLEL ACCESS MEMORIES

[75] Inventors: Kevin C. McDonough; David S. Laffitte, both of Houston; John M. Hughes, Spring, all of Tex.

[73] Assignee: Texas Instruments Incorporated, Dallas, Tex.

[21] Appl. No.: 896,295

[22] Filed: Aug. 12, 1986

Related U.S. Application Data

[60] Continuation of Ser. No. 720,472, Apr. 5, 1985, abandoned, which is a division of Ser. No. 427,236, Sep. 29, 1982, Pat. No. 4,562,435.

[51] Int. Cl.[4] .................................................. G11C 7/00

[52] U.S. Cl. .................................... 365/189; 365/230; 340/799; 364/900

[58] Field of Search ............... 365/189, 221, 230, 233, 365/239, 240, 219, 220; 340/799; 364/900 MS File, 200 MS File

[56] References Cited

U.S. PATENT DOCUMENTS

| | | | |
|---|---|---|---|
| 3,166,739 | 1/1965 | Haynes | 365/220 |
| 4,239,993 | 12/1980 | McAlexander, III et al. | 365/205 X |
| 4,281,401 | 7/1981 | Redwine et al. | 365/189 X |
| 4,303,986 | 12/1981 | Lans | 364/900 |
| 4,326,202 | 4/1982 | Kidode et al. | 340/799 |
| 4,347,587 | 8/1982 | Rao | 365/189 |
| 4,412,313 | 10/1983 | Ackland et al. | 365/221 |
| 4,541,075 | 9/1985 | Dill et al. | 365/189 |

FOREIGN PATENT DOCUMENTS 52-124827 10/1977 Japan .

*Primary Examiner*—Joseph A. Popek

*Attorney, Agent, or Firm*—John G. Graham; Rodney M. Anderson

[57] ABSTRACT

A video display system employs a memory arrangement for the video data which is sequentially accessed for serial read-out of the bit-mapped video information at a high clock rate, and also randomly accessed in parallel by a microcomputer for generating and updating the information to be displayed. Parallel access to the memory by the microcomputer can occur while the serial video data is being clocked out, so microcomputer I/O and video output conflict only a very minimum amount. Dynamic MOS RAMs with a serial register added provide this dual port memory.

14 Claims, 27 Drawing Figures

VIDEO DISPLAY SYSTEM USING SERIAL/PARALLEL ACCESS MEMORIES

This is a continuation of application Ser. No. 720,472, filed Apr. 5, 1985, now abandoned which was a divisional of U.S. Pat. No. 4,562,435 filed Sept. 29, 1982, now U.S. Pat. No. 4,562,435, and issued Dec. 31, 1985.

BACKGROUND OF THE INVENTION

This invention relates to video display systems using a bit-mapped memory system for the video data, and more particularly to a semiconductor memory device for use in video displays or the like employing MOS random-access type read/write memory devices having both serial and parallel access.

Video displays are used with a wide variety of microcomputer-based systems, such as work processors, home computers, business computers and terminals, and the like. The data displayed on the video screen in a typical implementation of such system is read from a video memory which is bit-mapped, i.e., contains a one-for-one correspondance between the data bits stored in the memory array and the visable dots (called pixels) on the screen. The memory must be quite large, particularly for color video, and the access rate for video data must be quite high, 20 MHz or higher. Further, the microcomputer must be able to access the memory for update during a substantial fraction of the available time, making the operating speed of the memory more critical. The speed requirements might be met by bipolar or static MOS RAMs, but these are expensive and the bit density is low, adding to volume, complexity and cost of the system.

Memory devices of the N-channel silicon-gate MOS type employing one-transistor dynamic cells provide the smallest cell sizes, the highest bit density and lowest cost, and are thus the most widely used in computers and digital equipment. The extremely high volume of manufacture of such devices has resulted in a continuing reduction in cost according to "learning curve" theory, and this trend will continue s volume increases. In addition, improvements in line resolution and other process factors have made possible increases in bit density during the last ten years from 1K through 4K and 16K to 64K bits for devices now in volume production, with 256K-bit and 1-Megabit devices being designed. The MOS dynamic RAM has a relatively slow access time, however, compared to bipolar or static MOS RAMs, and in a given production run the faster dynamic RAMs are usually of lower yield and thus the most expensive.

Dynamic RAM devices with serial ports are disclosed in U.S. Pat. Nos. 4,347,587, issued to G. R. Mohan Rao, 4,281,401 and 4,330,852, issued to Donald J. Redwine Lionel S. White and G. R. Mohan Rao, and 4,322,635 and 4,321,695 issued to Donald J. Redwine, all assigned to Texas Instruments. These devices are similar in structure to the widely used 64K-bit "by 1" dynamic RAM devices as described in U.S. Pat. No. 4,239,993, but a 256-bit serial shift register is added for serial I/O.

It is the principal object of this invention to provide a dual-port semiconductor memory arrangement for use in a system such as a video display by employing the same basic design of a widely-used MOS dynamic RAM, with additional sequential serial access capability to meet the high bit rate performance required by high resolution color video displays while also retaining the traditional parallel random access capability without performance loss, still retaining the economics of large scale manufacture and taking advantage of the design improvements of the MOS DRAM. Another object is to provide this improved serial/parallel type of access in memory devices which are of lower cost and susceptible to volume production, especially for applications such a video display systems.

SUMMARY OF THE INVENTION

In accordance with one embodiment of the invention, a video display system employs a memory arrangement for the video data which is accessed for serial read-out of the bit-mapped video information at a high clock rate, and also accessed in parallel by a microcomputer for generating and updating the information to be displayed. Parallel access to the memory by the microcomputer can occur while the serial video data is being clocked out, so microcomputer I/O and video output conflict only a very minimum amount. Dynamic MOS RAMs with a serial register added provide this dual port memory.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
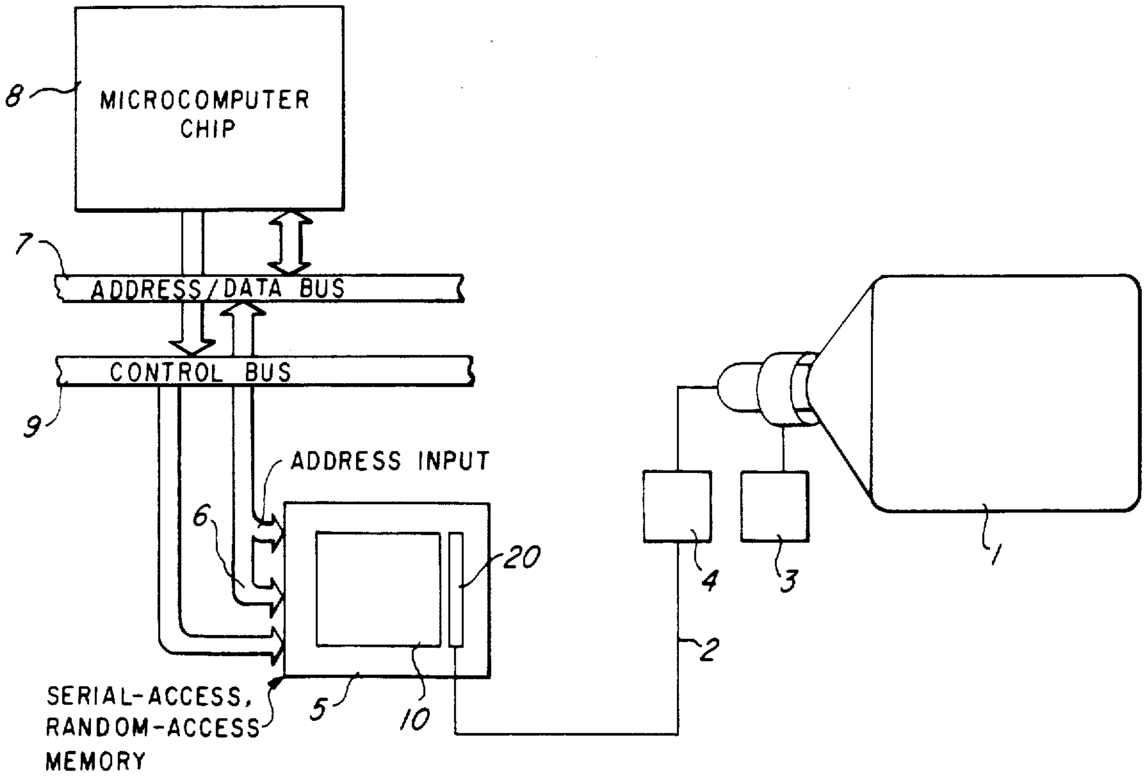
FIG. 1 is an electrical diagram in block form of a video display system according to one embodiment of the invention.

Referring to FIG. 1 a video display system in shown which employs the dual-port bit-mapped memory arrangement of one embodiment of the invention. A video display 1 of the conventional raster-scanned CRT type is employed, and a video signal input 2 to this display consists of bit-serial data at a rate of about 20 MHz or more. The standard TV signal provides 60 frames per second, interlaced, at 512 lines per frame, and each line may be thought of as containing several hundred dots or pixels; the product of these numbers is in the order of 20

MHz. For a black and white picture, each dot can be defined by from one bit for simple white or black display, up to perhaps four bits for sixteen shades of gray. Color may require three or four streams or planes of data and will require at least one byte (8-bits) per pixel for even a relatively simple display. The horizontal and vertical scanning and synchronizing circuitry 3 and video signal shaping circuitry 4 are not part of this invention and will not be discussed, but it is assumed that a complete TV monitor or receiver as needed is associated with the display 1. The video data on input 2 is received from a bit-mapped video memory 5 as will be described, and this memory is assumed to have one bit for each corresponding bit on the video screen 1 for the simple case of a two level black and white TV display. The memory 5 has a "parallel" port 6 in addition to the serial port 2, and this port 6 is coupled to a multiplexed address/data input/output but 7 of a micocomputer (or microprocessor) 8. The memory 5 receives addresses on the bus 7 to define the address for the serial port 2 and also to define address for writing into the memory (or reading from the memory) via the parallel port 6. A control bus 9 coupling the microcomputer 8 to the memory 5 provides the basic clock frequency Φ which clocks the serial video data out on the line 2, as well as memory controls such as Address Latch, $\overline{RAS}$, $\overline{CAS}$, Serial Select, Write Enable, etc., as may be required, depending upon the characteristics of the memory device and microcomputer.

The memory 5 includes a memory array 10 composed of rows and columns of memory cells, partitioned according to the size and type of video display 1 and the chosen memory type. That is, a standard two-level black and white TV raster requires about 512×512 or 256K-bits of memory per complete frame, so if 64K memory devices are used then four are required to make up the memory 5. These four may alternate in feeding 256-bit blocks serially onto the line 2, or other formats as may be appropriate. A black & white display having less resolution may employ only one 64K memory array, providing 256×256 pixels.

Figure 2:
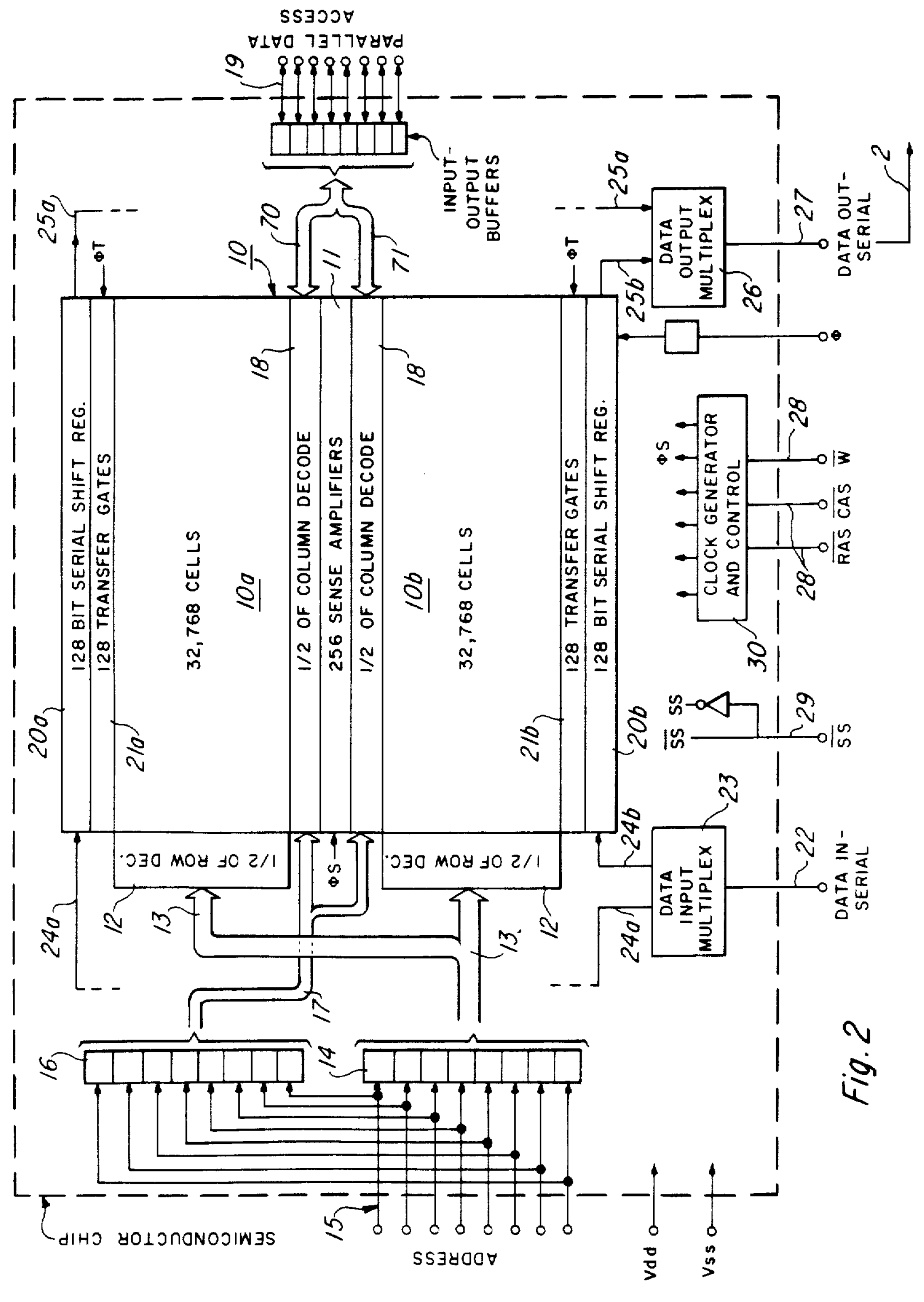
FIG. 2 is an electrical diagram in block form of a semiconductor memory device which uses the parallel and serial access features of the invention, for use in the system of FIG. 1.

One example of a memory device 5 which may be used in the system of FIG. 1 is shown in FIG. 2. This is a 64K-bit MOS dynamic read/write memory using one-transistor cells, as shown in U.S. Pat. No. 4,239,993 issued to McAlexander, White and Rao, assigned to Texas Instruments, but with a serial register added, and the random access portion is byte wide in this example to accomodate a typical 8-bit mirocomputer 8.

As set forth below, if the memory is partitioned so as to include eight chips, for example, then the individual devices may be X1, and eight of these connected in parallel for access by the microcomputer. Other partitioning, such as X4, could also be employed.

The memory device of FIG. 2 is typically made by an N-channel, self-aligned, silicon gate double-level -polysilicon, MOS process, with all of the device being included in one silicon chip of about 1/30 of a square inch in size which usually would be mounted in a standard dual-in-line package having twenty-four pins or terminals. The device includes in this example an array split into two halves 10a and 10b of 32,768 cells each, in a regular pattern of 256 rows and 256 columns. Of the 256 rows or X lines, there are 128 in the array half 10a and 128 in the half 10b. The 256 column or Y lines are each split in half with one half being in each of the halves 10a and 10b. There are 256 sense amplifiers 11 in the center of the array; these are differential type bistable circuits made according to the invention disclosed and claimed in said U.S. Pat. No. 4,239,993, or in U.S. Pat. No. 4,081,701, issued to White, McAdams and Redwine, also assigned to Texas Instruments. Each sense amplifier is connected in the center of a column line, so 128 memory cells are connected to each side of each sense amplifier by a colume line half. The chip requires only a single 5 V supply Vdd, along with a ground terminal Vss.

A row or X address decoder 12, split into two halves, is connected by sixteen lines 13 to either address buffers or latches 14. The buffers 14 are made according to the invention disclosed in U.S. Pat. No. 4,288,706 issued to Reese, White and McAlexander, assigned to Texas Instruments. An eight-bit X address is applied to inputs of the address buffers 14 by eight address input terminals 15. The X decoder 12 functions to select one of the 256 row lines as defined by an eight bit address on the input terminals 15 received via bus 7 from the microcomputer 8.

A column address is also received on the input pins 15 and latched into column address latches 16. For a byte-wide random-access data input/output, only five column address bits are needed, although the microcomputer may output additional column address bits to select among several chips; these are taken care of by chip-select decoders of conventional construction. The outputs of the column address latches 16 are connected by lines 17 to a decoder 18 in the center of the array which selects eight-of-256 columns to produce a byte wide input/output on eight lines 19. Rows of dummy cells (not shown) are included on each side of the sense amplifiers as is the usual practice.

As thus far described, the memory device is similar to a standard dynamic RAM, but with byte-wide or other such parallel access, however, according to the invention, serial input/output is provided in addition to single-bit or byte-wide random access. A 256 bit serial shift register 20 shift into two identical halves 20a and 20b is utilized, with the halves positioned at opposite sides of the array 10. The shift register 20 may be loaded from the column lines of the array 10 for a read cycle, or loaded into the column lines for write (not needed in the simplist video applications as in FIG. 1), by 128 transfer gates 21a on one side or a like number of gates 21b on the other side. Data input to the device for serial write is by a data-in terminal 22 which is connected by a multiplex circuit 23 to inputs 24a and 24b of the shift register halves. Data is read out serially from the register halves 20a and 20b by lines 25a and 25b, a data-out multiplex circuit 26, a buffer, and a data-out terminal 27. The shift register 20a and 20b is operated by a clock Φ which is used to shift the bits through the stages of the register, two stages for each clock cycle. For read operations it takes only 128 cycles of the clock Φ to output 256 bits from the 256 bits of the split register 20a and 20b. A control ΦT applied to the gates 21a and 21b connects the 256 bits of the shift register to the 256 column lines in the array halves 10a and 10b. In a serial write operation, the sense amplifiers 11 are operated by Φs occuring after ΦT to set the column lines at a full logic level, after which one row line (selected by the address in the latches 14) is actuated by Xw and the data forced into the memory cells of this row. A serial read cycle starts with an address on the input 15 which is decoded to activate one of the 256 X or row address lines (and a dummy cell on the opposite side). The sense amplifiers 11 are then actuated by a Φs clock to force the column lines to a full logic level, and then the transfer gates 21a and 21b actuated by $\Phi T$ to move the 256 bits from the selected row into the corresponding shift register halves 20a and 20b. The shift clock $\Phi$ is then applied to move the 256 bits onto the output pin 27 in serial format via the multiplex circuit 26, at two stages per clock cycle requiring 128 clock $\Phi$ cycles. The output pin 27 is connected to the video input 2 of FIG. 1.

Figures 3A, 3B, 3C, 3D, 3E:
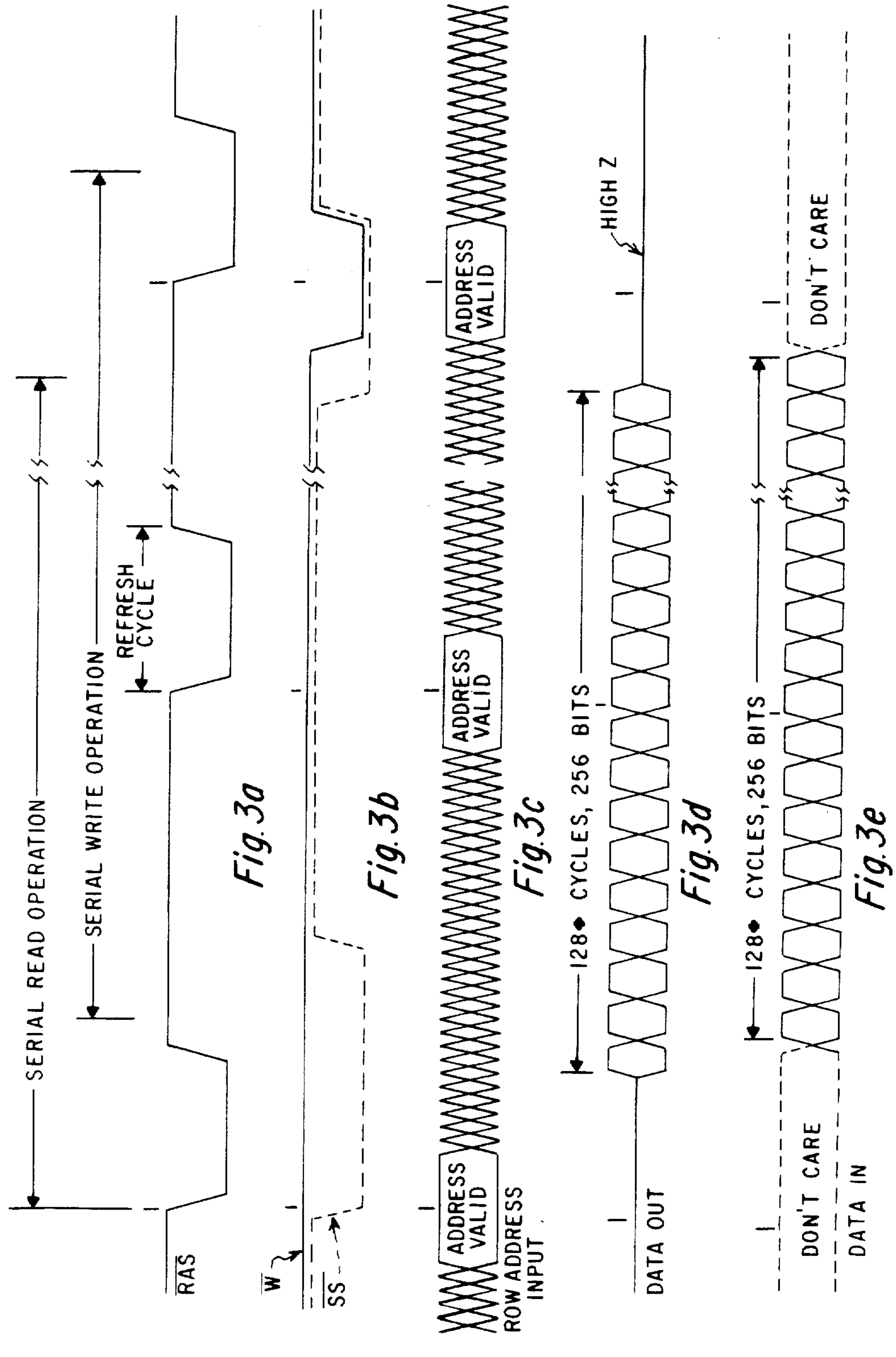
FIGS. 3a–3q are graphic representations of voltage vs. time or other conditions vs. time existing for various parts of the device of FIG. 2.

The X address must appear on the inputs 15 when a row address strobe $\overline{RAS}$ seen in FIG. 3a is applied to a control input 28. A column address strobe $\overline{CAS}$, and a read/write control $\overline{W}$ as seen in FIG. 3b are other controls 28 for random parallel access to the device. These inputs are applied to clock generator and control circuitry 30 which generates a number of clocks and control signals to define the operation of various parts of the device. For example, when $\overline{RAS}$ goes low as seen in FIG. 3a, these clocks derived from $\overline{RAS}$ cause the buffers 14 to accept and latch the eight bits then appearing on the input lines 15. The row address must be valid during the time period shown in FIG. 3c. Serial access is controlled by an $\overline{SS}$ serial select command on input 29. For a serial read operation, $\overline{SS}$ goes to active-low and the $\overline{W}$ signal is high during the period seen in FIG. 3b, and the data output on the terminal 27 will occur during the time period of 128 cycles seen in FIG. 3d. For a serial write operation, the $\overline{SS}$ and $\overline{W}$ signal must be active-low as seen in FIG. 3b and the data-in bits must be valid during the preceeding time period of 128 cycles seen in FIG. 3e. Refresh occurs every time a row address appears on the inputs 16 and $\overline{RAS}$ goes low. Thus, during the 128 cycles when the shift register halves 20a and 20b are be read out through data-out pin 27, refresh can be occurring by loading a new row address into the chip 5 along with a $\overline{RAS}$ signal. The shift register 20a and 20b is not disturbed so long as $\Phi T$ does not occur; the transfer command $\Phi T$ is controlled by $\overline{SS}$. Serial data can be shifted into the register halves 20a and 20b while data is being shifted out, and so a write operation can begin just after a read operation is initiated; although not needed in the system of FIG. 1, this feature is important for the other embodiments.

Figures 3F, 3G, 3H, 3I:
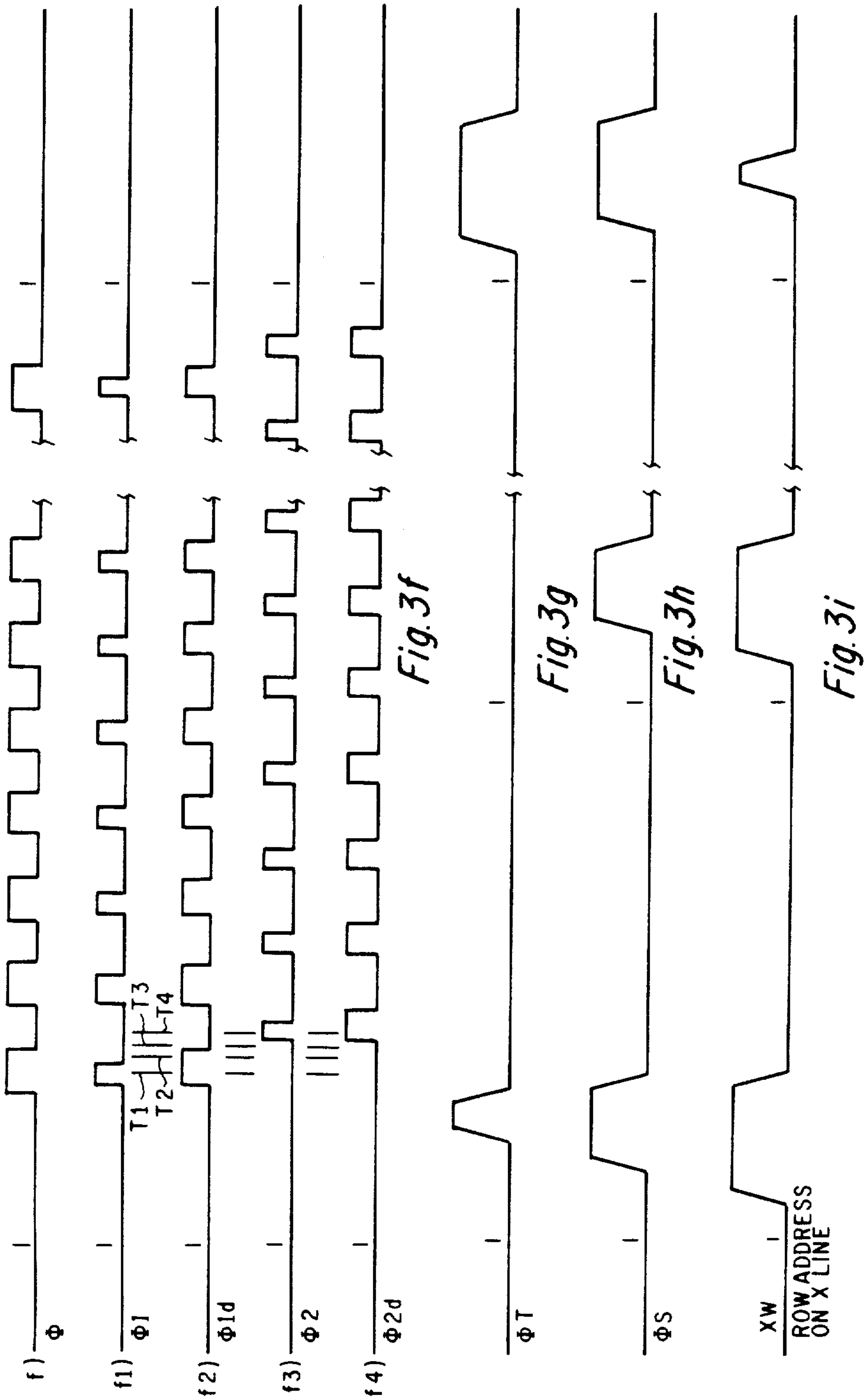
Figure 3J:
Figure 3K:
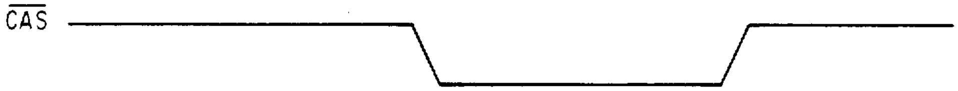
Figure 3M:
Figure 3N:
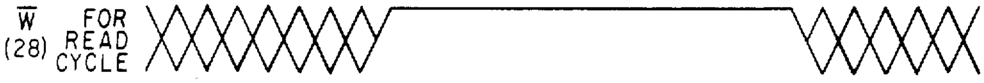
Figure 3O:
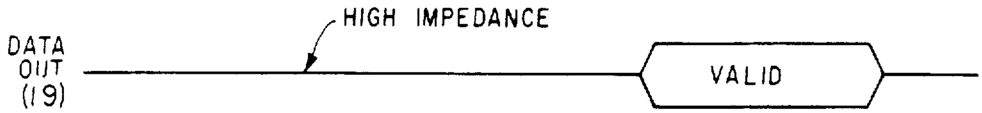
Figure 3P:
Figure 3Q:

Parallel access occurs as illustrated in the timing diagram of FIGS. 3j–3q; note that those Figures are on an expanded time scale compared to FIGS. 3a–3i. The X address must appeal on the inputs 15 when a row address strobe signal $\overline{RAS}$ is applied to an input 28. Likewise, the Y or column address must appear during a column address strobe signal $\overline{CAS}$ on another input 28. A read/write control $\overline{W}$ on an input 28 is the other control signal for the parallel access. When $\overline{RAS}$ goes low as seen in FIG. 3j, clocks derived from $\overline{RAS}$ cause the buffers 14 to accept and latch the eight TTL level bits then appearing on the input lines 15. When $\overline{CAS}$ goes low as seen in FIG. 3k then clocks generated in the circuitry 30 cause the buffers 16 to latch on the TTL level Y address signals on the inputs 5. The row and column addresses must be valid during the time periods shown in FIG. 3m. For a read cycle, the $\overline{W}$ signal on input 29 must be high during the period seen in FIG. 3n, and the output on the terminals 19 will be valid during the time seen in FIG. 3o. For a write-only cycle, the $\overline{W}$ signal must be low as seen in FIG. 3p and the data-in bits must be valid on terminals 19 during the time seen in FIG. 3q.

The serial access via terminals 22 and 27 and shift register 20 is usually sequential in that the row address is incremented by one following each access. The video data is a continuous stream of 256-bit serial blocks, one after the other, so the next address for serial access, after the $\Phi T$ transfer occurs, will alwys be the last row address plus one. In the simplist embodiment, the microcomputer 8 sends out the row addresses for serial read, so an address counter in the microcomputer will be incremented after each serial read is commanded. This function may be done on the chip of FIG. 2 as will be explained. In contrast, the parallel access via terminals 19 is random rather than sequential and addresses must be generated in the microcomputer 8.

Figure 4:
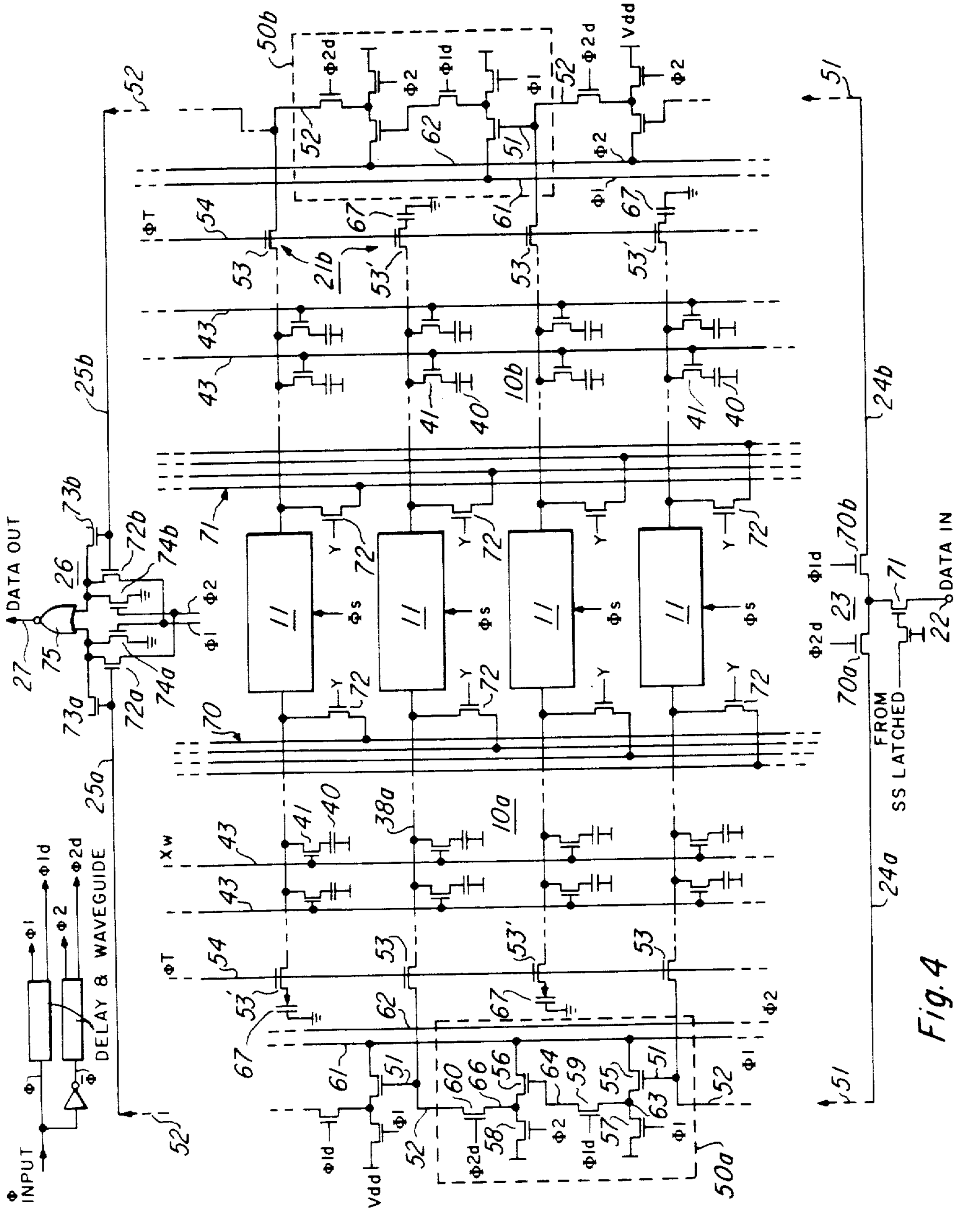
FIG. 4 is an electrical schematic diagram of the cell array in the device of FIG. 2.

In FIG. 4, a portion of the cell array 10 and the associated shift register stages 20a and 20b for the device of FIG. 2 are shown in schematic form. Four of the 256 identical sense amplifiers 11 positioned at the center of the array are shown connected to the four column line halves 38a or 38b. Connected to each column line half 38a or 38b are 128 one-transistor cells each having a storage capacitor 40 and a transistor 41. The cells are of the type described in U.S. Pat. No. 4,240,092 issued to C-K Kuo, assigned to Texas Instruments, or U.S. Pat. No. 4,012,757. Row lines 43 are the outputs of the row decoders 12 and are connected to the gates of all of the transistors 41 in each row; there are 256 identical row lines 43 in the array. Also connected to each column line half 38a or 38b are dummy cells of conventional form, not shown. When the Xw address selects one of the lines 43 in the array half 10a on the left, the associated transistor 41 is turned on to connect the capacitor 40 for this selected cell to the column line half 38a, while at the same time a dummy cell select line on the opposite side is activated, connecting a dummy capacitor to the column line half 38b.

The serial I/O register 20a and 20b is composed of shift register stages 50a or 50b positioned on opposite sides of the cell array. The input 51 of each stage is connected to receive the output 52 of the next preceeding stage, in the usual manner. The register is operated by a two phase clock $\Phi 1$, $\Phi 2$, plus delayed clocks $\Phi 1d$ and $\Phi 2d$, which are derived from a clock $\Phi$ supplied from external to the chip. That is, the clock $\Phi$ is used to generate another clock in phase opposition then each of these is used to generate the delayed clocks. The input 24a or 24b of the first of the stages 50a or 50b is from the data-in multiplex circuit 23, and the output from the last of the stages 50a and 50b goes to the data-out multiplex circuit 26. The transfer gates 21a or 21b consist of 256 identical transistors 53 having source-to-drain paths in series between the column line halves 38a or 38b and the shift register stages 50a or 50b. The gates of the transistors 53 are connected by a line 54 to the $\Phi T$ source.

The stages 50a or 50b of the shift register are of the four-phase dynamic ratioless type, with improved noise margin and speed characterics, as disclosed in U.S. Pat. No. 4,322,635 issued to Donald J. Redwine, assigned to Texas Instruments. This type of shift register stage uses minimum size transistors and dissipates low power, yet can be clocked at a high rate. Each register stage 50a or 50b consists of first and second inverter transistors 55 and 56 with a clocked load transistor 57 or 58 for each inverter. A transfer transistor 59 or 60 couples each inverter to the next. The drains of loads 57 and 58 go to +Vdd, and the sources of inverter transistors 55 and 56 are connected to $\Phi 1$ or $\Phi 2$ on lines 61 and 62.

The operation of one stage may be understood by examining the circuit conditions at each of four distinct instants in time, T1 through T4 seen in FIGS. 3f1 to 3f4. At time T1, $\Phi 1$ and $\Phi 1d$ are high while $\Phi 2$ and $\Phi 2d$ are low; this is an unconditioned precharge period in which transistors 57 and 59 are on and nodes 63 and 64 are charged to a high level. During this time the transistors 58 and 60 are off, implying that the voltage on the nodes 51 and 52 may be either high or low depending upon the data in the register. Since Φ2 is low and node 64 is being precharged, the transistor 56 will be turned on, discharging node 66 to a low state or Vss back through the source of transistor 56. This action sets up a favorable charge storage condition on node 64 by forcing the drain, channel, and source of transistor 56 to a low state.

At time T2, Φ1 goes low, Φ1*d* remains high, and it is during this time that nodes 63 and 64 may change; they may remain high if there is a low stored on input node 51 or they may go low by discharging through transistor 55 to Vss (Φ1 being low) if there is a high stored on the node 51. In either case the complement of the data on the input node 51 is transmitted to the node 64. As Φ1*d* goes low, we enter time T3 in which the transistor 59 is cut off and the voltage on the node 64 is isolated; all clocks are low and the circuit is in a quiescent condition.

The time T4 initiates an unconditional precharge time for the second half of the stage, similar to that occuring during T1 for the first half, with the final result being that by the end of Φ2*d* the data has been recomplemented and appears on the output node 52. A one-bit or one-stage delay time therefore requires one Φ1, Φ1*d* clock pair plus one Φ2, Φ2*d* clock pair.

The shift register stages are connected to alternate ones of the column lines 38*a* or 38*b* on opposite sides of the array 10. The advantage of this split arrangement is that the six transistors per stage may be more easily laid out to fit between the two alternate column lines rather than between adjacent column lines. The pitch of column lines in a dynamic RAM array of the type discussed here is only a few microns; a greater layout area for the six transistors of a shift register stage is obviously available in twice this pitch.

The same result could be accomplished by placing both halves 50*a* and 50*b* of the split shift register on the same side of the array, but laid out one above the other. The layout of FIGS. 1 or 3 with all even bits on one side and all odd bits on the other side of the array is advantageous, however, because of the balance for optimum operation of the sense amplifiers. A dynamic RAM employing folded bit lines as illustrated in Electronics, Mar. 24, 1982, p. 134, would have the shift register halves on the same side of the array, but connected to Alternate Columns, the electrical equivalent of FIG. 4.

A dummy transfer transistor 53' is positioned at the end of each column line when not used on that side to connect to a shift register stage. This electrically and physically balances the inputs to the sense amplifiers 11 and also connects to a dummy capacitor 67 which functions when sensing the voltage transferred from the register 20*a*, 20*b*. When the ΦT signal appears on lines 54, the same amount of noise is coupled to both sides of the column line 38*a* and 38*b* through the capacitance of the transistors 53 or 53' on each side, so that noise pulse is in effect cancelled out as an input to the differential sense amplifiers; for balance, a capacitance 67 like the dummy capacitance (not shown) is coupled to the column line on the side opposite the stage 50*a* or 50*b* being sensed.

A serial data-in multiplex circuit 23 for directing alternate bits to the inputs 24*a* or 24*b* includes a pair of transistors 70*a* and 70*b* which have gates driven by Φ1*d* and Φ2*d*. A transistor 71 in series with these has the serial select latched SS on its gate, so data only goes into the shift register of the selected chip or chips in a multichip memory board. A serial data output multiplex circuit 26 includes transistors 72*a* and 72*b* having Φ1 or Φ2 on their drains and the last stage outputs 25*a* or 25*b* on their gates; gated capacitors 73*a* or 73*b* couple each gate to its respective source. Transistors 74*a* and 74*b* short the output of one to Vss when the other is valid, being driven by Φ1 and Φ2. A NOR gate 75, produces the output to terminal 27.

The serial data-in or data-out rate is twice the clock rate Φ. Only 128 Φ cycles are needed to transfer in or transfer to 256 serial bits as seen in FIGS. 3*d* or 3*e*. This result is accomplished due to the fact that the shift register is split. Two clocks are needed to shift a bit of data one position, so if all 256 stages were in series, then 256 clock cycles would be needed. A part of this type can be clocked at about 10 MHz, for example, so a serial data rate of 20 MHz is possible.

In the circuit of FIG. 4, random access is provided by sets of eight data lines 70 and eight data bar lines 71 positioned on opposite sides of the sense amplifiers (only four of each are shown). The column lines 38*a*, 38*b* are selectively connected to the data and data bar lines 70, 71 by Y-select transistors 72 which have the Y decoder 18 outputs on their gates. The Y decoder 18 selects eight columns (out of 256) and applies a logic-1 voltage to the gates of eight transistors 72 on the side of data lines 70 and the corresponding eight transistors 72 on the side of the data lines 71, thus coupling the selected eight column lines 38*a*, 38*b* to the input/output terminals 19 (through suitable buffers, of course). A random-access or parallel access by the lines 70, 71 and terminals 19 requires only aobut one cycle time, compared to 128 clock Φ periods for serial access. A cycle time for the memory is not necessarily the same as the Φ period. For example, if the clock Φ is at 10 MHz, its period is 100 nsec., whereas the parallel read access time may be 150 nsec.

The timing of the ΦT, ΦS and Xw signals is different for serial read, refresh and serial write. The voltages are seen in FIGS. 3*g*, 3*h* and 3*i*; read and refresh are the same except refresh has no transfer command ΦT, and reversal for write is necessary because of the reversed sequence. In the case of a serial read cycle the data from a row of the memory capacitors 40 is transferred through a row of transistors 41 by the Xw voltage to the column lines, then detected by the sense amplifiers 11 at ΦS, then coupled through the transfer gates 21*a*, 21*b* at ΦT to the shift register 20*a*, 20*b*. The opposite sequence must occur for the serial write cycle where the transfer gates 21*a*, 21*b* must turn on first at ΦT as the data in the shift register is transferred to the column lines 38*b*, then data is sensed at ΦS, after which Xw goes high momentarily to turn on a selected row of transistors 41 and thus load the data state of the serial shift register into the selected row of capacitors 40 in the cell array 10.

The proper sequence is selected by sensing the $\overline{W}$ command at the start of a cycle, just as an address is sensed, and employing this information in the clock generators 30. The command ΦT, generated from occurrence of $\overline{RAS}$ and $\overline{SS}$, is switched in timing between early or later compared to $\overline{RAS}$ depending upon whether $\overline{W}$ is low or high, as seen in FIGS. 3*g*–3*i*.

Figure 5:
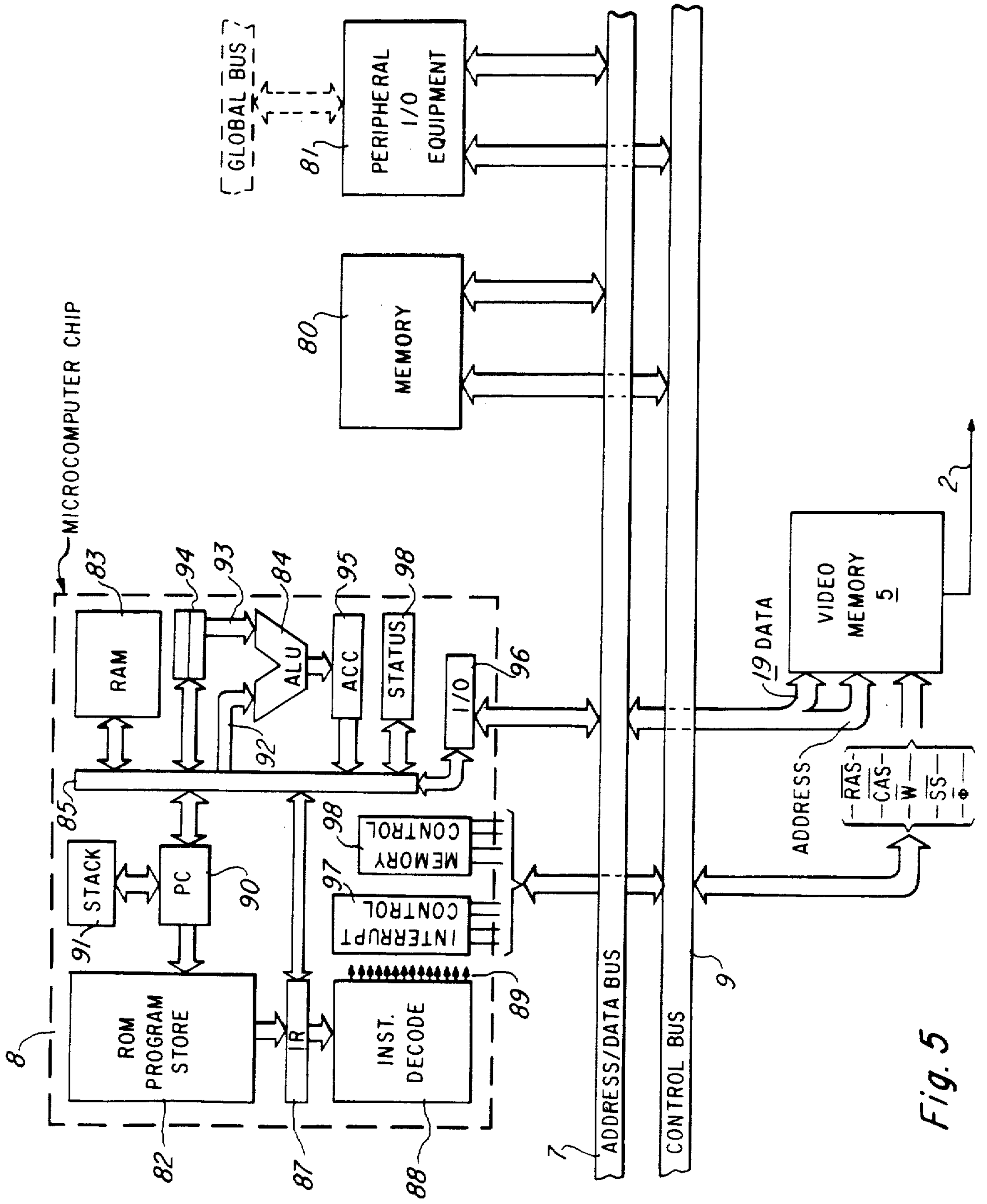
FIG. 5 is an electrical diagram in block form of a microcomputer device which may be used in the system of FIG. 1.

Referring to FIG. 5, a microcomputer which may be used with the system of the invention may include a single-chip microcomputer device 8 of conventional construction, along with additional off-chip program or data memory 80 (if needed), and various peripheral input/output devices 81, all interconnected by an address/ data bus 7, and a control bus 9.

A single bidirectional multiplexed address/data bus 7 is shown, but instead separate address and data busses may be used, and also the program addresses and data or I/O addresses may be separated on the external busses; the microcomputer may be of the Von Neumann architecture, or of the Harvard type or a combination of the two.

The microcomputer 8 could be one of the devices marketed by Texas Instruments under the part number of TMS 7000, for example, or one of the devices commercially available under part numbers Motorola 6805, Zilog Z8 or Intel 8051, or the like. These devices, while varying in details of internal construction, generally include an on-chip ROM or read-only memory 82 for program storage, but also may have program addresses available off-chip, but in any event have off-chip data access for the memory 5.

A typical microcomputer 8 as illustrated may contain a RAM or random access read/write memory 83 for data and address storage, and ALU 84 for executing arithmetic or logic operations, and an internal data and program bus arrangement 85 for transferring data and program addresses from one location to another (usually consists of several separate busses). Instructions stored in the ROM 82 are loaded one at a time into an instruction register 87 from which an instruction is decoded in control circuitry 88 to produce controls 89 to define the microcomputer operation. The ROM 82 is addressed by a program counter 90, which may be self-incrementing or may be incremented by passing its contents through the ALU 84. A stack 91 is included to store the contents of the program counter upon interrupt or subroutine. The ALU has two inputs 92 and 93, one of which has one or more temporary storage registers 94 loaded from the data bus 85. An accumulator 95 receives the ALU output, and the accumulator output is connected by the bus 85 to its ultimate destination such as the RAM 83 or a data input/output register and buffer 96. Interrupts are handled by an interrupt control 97 which has one or more off-chip connections via the control bus 9 for interrupt request, interrupt acknowledge, interrupt priority code, and the like, depending upon the complexity of the microcomputer device 8 and the system. A reset input may also be treated as an interrupt. A status register 98 associated with the ALU 84 and the interrupt control 97 is included for temporarily storing status bits such as zero, carry, overflow, etc., from ALU operations; upon interrupt the status bits are saved in RAM 83 or in a stack for this purpose. The memory addresses are coupled off-chip through the buffers 96 connected to the external bus 7; depending upon the particular system and its complexity, this path may be employed for addressing off-chip data or program memory 80 and I/O 81 in addition to off-chip video memory 5. These addresses to bus 7 may originate in RAM 83, accumulator 95 or instruction register 87, as well as program counter 90. A memory control circuit 99 generates (in response to control bits 89), or responds to, the commands to or from the control bus 9 for address strobe, memory enable, write enable, hold, chip select, etc., as may be appropriate.

In operation, the microcomputer device 8 executes a program instruction in one or a sequence of machine cycles or state times. A machine cycle may be 200 nsec., for example, for a 5 MHz clock input applied by a crystal to input 100 to the microcomputer chip. So, in successive machine cycles or states, the program counter 90 is incremented to produce a new address, this address is applied to the ROM 82 to produce an output to the instruction register 87 which is then decoded in the control circuitry 88 to generate a sequence of sets of microcode control bits 89 to implement the various steps needed for loading the bus 85 and the various registers 94, 95, 96, 98, etc. For example, a typical ALU arithmetic or logic operation would include loading addresses (fields of the instruction word) from instruction register 87 via bus 85 to addressing circuitry for the RAM 83 (this may include only source address or both source and destination addresses), and transferring the addressed data words from the RAM 83 to a temporary register 94 and/or to the input 92 of the ALU; microcode bits 89 would define the ALU operation as one of the types available in the instruction set, such as add, subtract, compare, and, or, exclusive or, etc. The status register 98 is set dependent upon the data and ALU opeation, and the ALU result is loaded into the accumulator 95. As another example, a data output instruction may include transferring a RAM address from a field in the instruction to the RAM 83 via bus 85, transferring this addressed data from the RAM 83 via bus 85 to the output buffer 96 and thus out onto the external address-/data bus 7; certain control outputs are produced by memory control 99 on lines of the control bus 9 such as write enable, etc. The address for this data output could be an address on the bus 7 via buffer 96 in a previous cycle where it is latched in the memory 80 or memory 5 by an address strobe output from the memory control 99 to the control bus 9. An external memory controller device may be used to geenrate the $\overline{RAS}$ and $\overline{CAS}$ strobes. A two-byte address for the memory 5 would be applied to the bus 7 in two machine cycles if the bus 7 is 8-bit, or in one cycle if the bus is 16-bit.

The instruction set of the microcomputer 10 includes instructions for reading from or writing into video memory 5, the additional memory 80 or the I/O ports 81, with the internal source or destination being the RAM 83, program counter 90, temporary registers 94, instruction register 87, etc. In a microcoded processor each such operation involves a sequence of states during which addresses and data are transferred on internal bus 85 and external bus 7. Alternatively, the invention may use a microcomputer 8 of the non-microcoded type in which an instruction is executed in one machine state time. What is necessary in selecting the microcomputer 8 is that the data and addresses, and various memory controls, be available off-chip, and that the data-handling rate be adequate to generate and update the video data within the time constraints.

The video memory arrangement of the invention is described in terms of 8-bit data paths for the bus 7, although it is understood that the microcomputer system and the memory technique is useful in either 8-bit or 16-bit systems, or other architectures such as 24-bit or 32-bit. One utility is in a small system of the type having 8-bit data paths and 12-bit to 16-bit addressing, in which no external memory 80 is needed and the peripheral circuitry 81 consists of merely a keyboard or like interface, plus perhaps a disc drive. A bus interface chip such as an IEEE 488 type of device could be included in the peripheral circuitry 81, for example.

Figure 6:
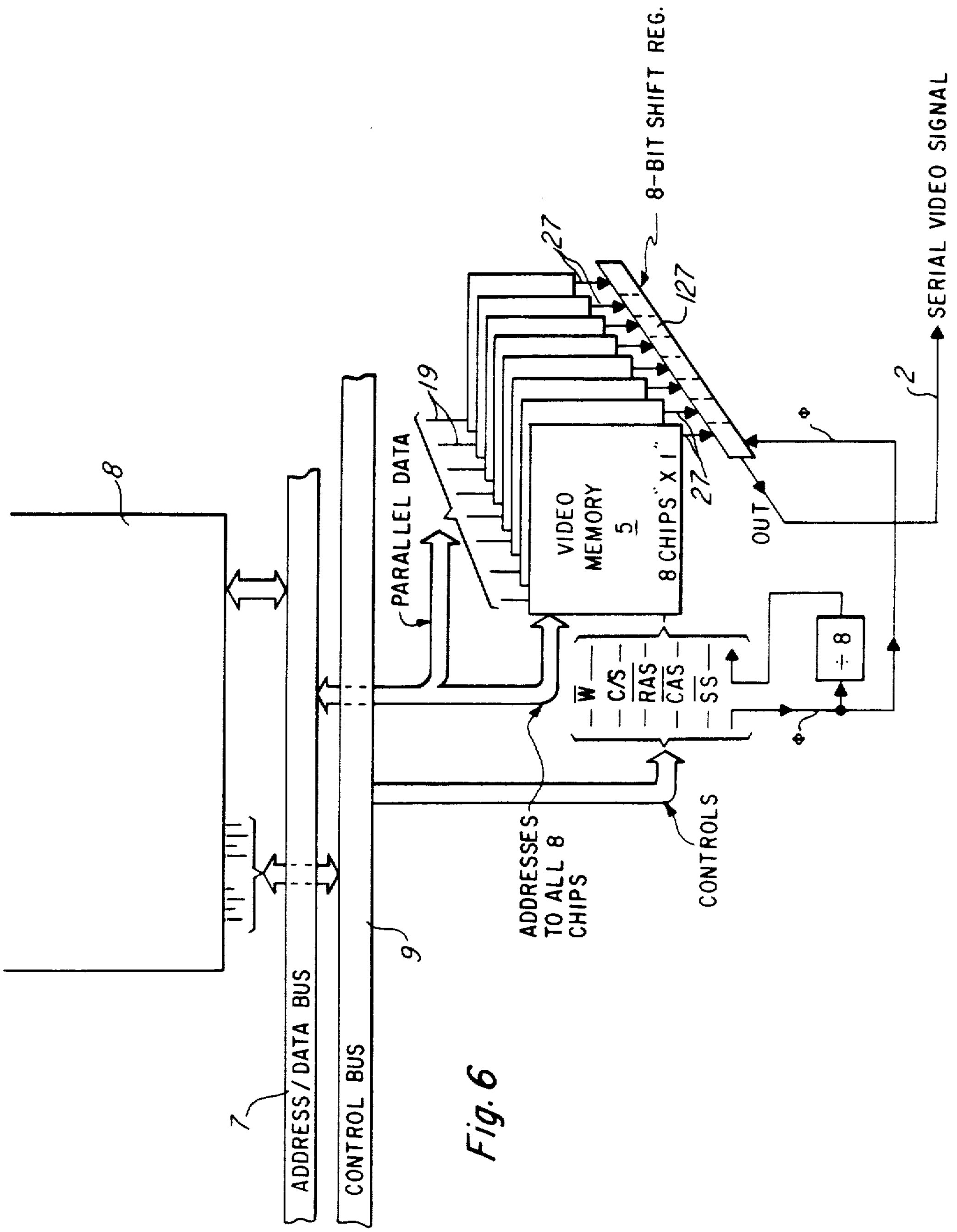
FIG. 6 is an electrical diagram in block form of a video display system corresponding to FIG. 1 according to another embodiment of the invention.

As illustrated in FIG. 6, the video memory 5 may be configured as eight ×1 memory devices instead of one ×8 device. In this embodiment eight semiconductor chips 5 are used, all eight being 64K×1 or perhaps 16K×1, each with serial output registers as before in FIG. 2, but with one bit wide I/O instead of eith I/O lines 19. For a full-color TV type display 1, using 8-bits per tri-color dot, a memory system consisting of four banks (eight chips per bank) of 64K×1 memory devices would be required. Each line on the screen would use two 256-bit registers, clocked out one following the other, for each of eight video signal input lines 2 (instead of only one video data input 2 as shown). The microprocessor 8 and bus 7 would access the 8-bit video data in parallel in a "×1" format on each chip (instead of ×8 as seen in FIG. 2) by the eight data lines 6, one for each chip, as seen in FIG. 6. The address inputs 15 for all eight chips receive the same addresses from the bus 7, and all eight chips receive the same control inputs from bus 9. The eight serial outputs 27, one from each chip, are connected to respective bits of an eight-bit shift register 127. The serial clock Φ is divided by eight before application to the eight chips 5; the clock Φ applied to the serial register 127 thus shifts out eight bits onto the video signal input line 2 and then another eight bits are loaded into register 127 from the registers 20 on the individual chips. Alternatively, instead of using the auxiliary shift register 127, the eight outputs 27 can be connected to eight parallel video signal inputs of the color TV.

An inportant feature of the invention for some systems is the serial data input 22 of FIG. 2. The serial input may be video data from a receiver or a video tape playback mechanism 105 shown in FIG. 7 supplying a continuous serial video feed on line 106 to the input 22 of a chip as in FIG. 2. This incoming video data is written into the cell array 10 from the serial registers 20a, 20b, and while the RAM array it is processed by the microcomputer 8 using the parallel access port 19, and then supplied to the video signal line 2 via the register 20a, 20b and the terminal 27. An example of one use of this arrangement is to add test or graphics via the microcomputer on top of video supplied from the receiver or tape 105. Another example would be to enhance or correct the video from receiver or tape 105 by writing it serially into the array 10, reading the data out in parallel to store bytes temporarily in the RAM 83 of the microcomputer, performing operations via the ALU 84, then writing the corrected data back into the array 10 via bus 7, from whence it is read out serially onto the video signal input 2. th eadvantage of the system of the invention in this regard is that the register 20a, 20b can be serially loaded at the same time it is being serially read; that is, data-in and data-out overlap as seen in FIGS. 3d and 3e. During the 128 clock cycles used for serial-in and serial-out, the array 10 can also be accessed in parallel by microcomputer 8 for the write-over, update or correction operation.

Figure 8:
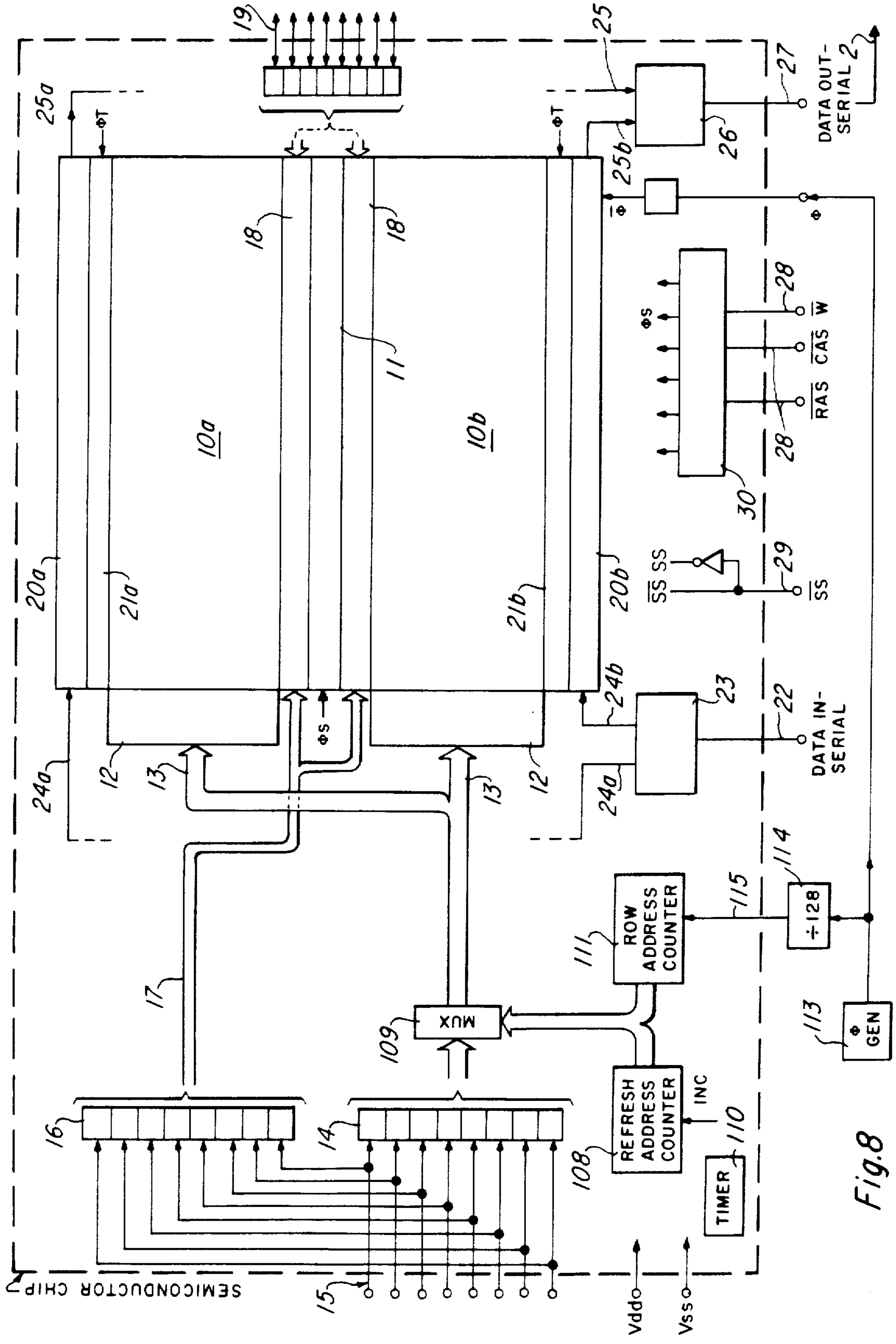
FIG. 8 is an electrical diagram in block form of a video display memory corresponding to FIG. 2 according to another embodiment of the invention.

Referring to FIG. 8, the semiconductor chip containing the array 10 may also include a row address counter 108 which generates an 8-bit 1-of-256 row address for coupling to the input 13 of the row decoders 12 by multiplex circuitry 109, so the row decoder can accept an address from either the address input terminals 15 via buffers 14 or from the counter 108. This counter may be self-incrementing so that a count of one is added to the existing count whenever an input Inc is received. The counter 108 may function as an on-chip refresh address generator as set forth in U.S. Pat. Nos. 4,207,618 and 4,344,157, issued to Lionel S. White & G. R. Mohan Rao, or U.S. Pat. No. 4,333,167, issued to David J. McElroy, all assigned to Texas Instruments. A column address is not needed for refresh; a row address Xw followed by a Φs clock functions to refresh all 256 cells in the addressed row, as discussed in reference to FIGS. 3a, 3h, and 3i. When a row is addressed for serial-read or serial-write, this also refreshes the data in this row; likewise, a parallel access refreshes a row upon read or write. Thus, if the video data is being sampled via serial read at the usual rates needed for TV scan then each row is not addressed within the 4 ms refresh period (60 frames/second is about 17 milliseconds between sampling). During the time between serial reads, the microcomputer 8 will probably, but not necessarily, access all rows for parallel read or write often enough for refresh. Thus, the microcomputer program in the ROM 82 could include a counter loop to send out an incremented row address and $\overline{RAS}$ at some fixed rate to assure that the refresh address specifications are met. However, to avoid occupying the microcomputer program execution with refresh overhead, the embodiment of FIG. 8 employs a counter 108 to provide the address on-chip, and the microcomputer need only apply the $\overline{RAS}$ control. That is, upon receipt of $\overline{RAS}$ and no $\overline{CAS}$ with $\overline{W}$ and $\overline{SS}$ high, the multiplex 109 is switched to apply the contents of the counter 108 to the row decode 12, and ΦS is activated, to refresh a row; no serial or parallel data in or out is inititated. An Inc command is produced to increment the counter 108 for the next refresh. Further, as another alternative embodiment, an on-chip refresh signal may be generated on-chip from a timer 110, as in U.S. Pat. No. 4,344,157, for example. The timer 110 produces a refresh command at least onece every (4 m sec.)×(1/256)=16 microsec. This refresh command activates multiplex 109, Φs and Inc just as the off-chip refresh request previously discussed.

The serial I/O via register 20, in most uses such as video, will always require access to sequential rows. Thus, an on-chip 8-bit 1-of-256 counter 111 may be employed as seen in FIG. 8 to avoid the necessity of applying a row address from the microcomputer 8 for serial access. If the sampling rate is high enough, this may be the same as the refresh counter 108; i.e., only one counter is needed as no separate provision for refresh is necessary. As in FIG. 8, however, the counter 111 produces a row address to the multiplex 109 whenever the $\overline{SS}$ command occurs, initiating a serial read or write (depending upon W), and so $\overline{RAS}$ and $\overline{CAS}$ are used only for parallel access. The counter 111 is self-incrementing, so every time it is activated to produce an address to multiplex 109, it is also incremented so the next request will produce the next sequential row.

Another feature of the invention is that the shift clock Φ may be generated separate from the microcomputer 8. As seen in FIG. 8, a clock generator 113 may be used to produce the shift clock Φ, and this clock divided by 128 in the divider 114 to produce an input 115 to the row address counter 111 as well as an input to the clock circuitry 30 to initiate a serial read after every 128 Φ cycles. The Φ generator 113 and divide-by-128 circuit 114 may be off-chip as seen in FIG. 8, or alternatively on the chip with the array 10. Note that serial access and parallel access to the array 10 via register 20 and lines 19 may be asynchronous; that is, the Φ generator 113 need not be synchronized with the clock of the microcomputer 8, but instead may be synched with the video display 1 of FIG. 1 or the video signal 106 from receiver 106 of FIG. 7.

Figure 7:
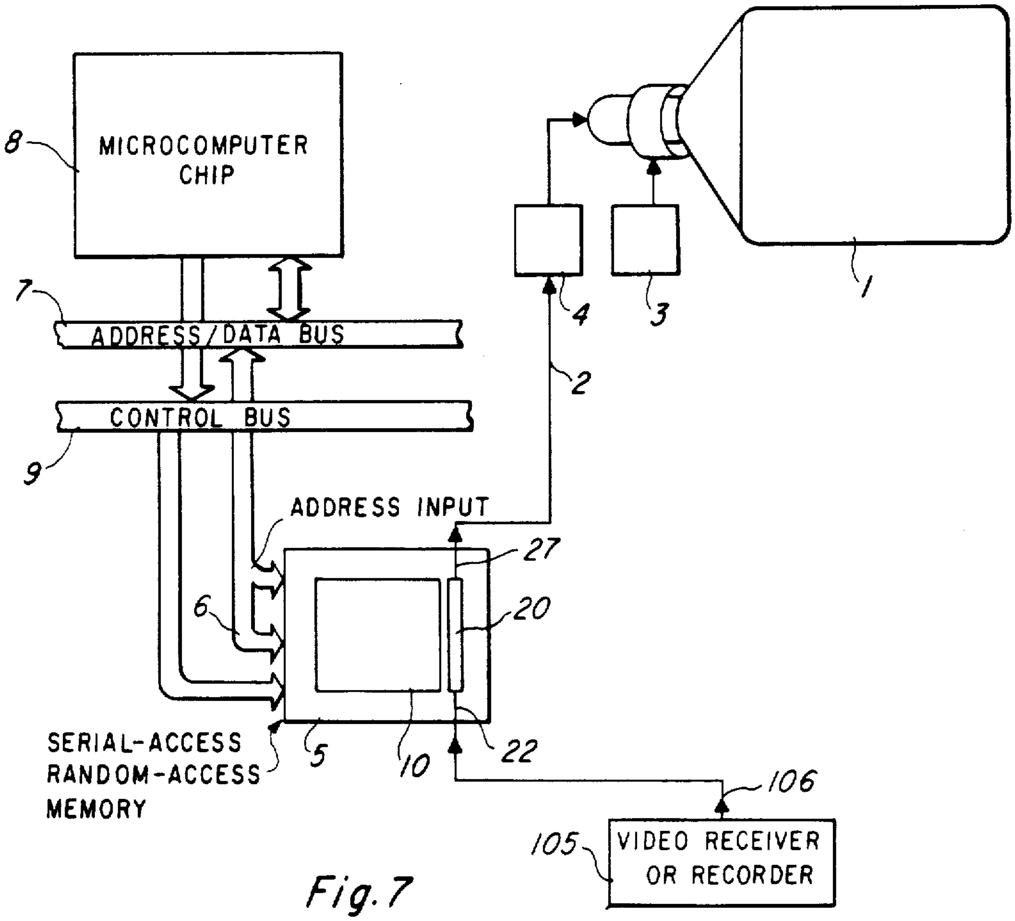
FIG. 7 is an electrical diagram in block form of a video display system corresponding to FIG. 1 according to another embodiment of the invention.

A system that advantageously utilizes these features of the embodiment of FIG. 7 with serial input is an interactive home TV adapted for games, education use, or catalog ordering, as examples. That is, a video background is fed into serial input 22 from cable or VCR, and the user superimposes his input via microcomputer 8 (employing a keyboard, joystick, or the like coupled via I/O 81), and the resulting composite video is applied to the screen 1 via line 2. This same video data, or alternatively only the variable added data, may be retransmitted via cable or rf to the originator for applications such as catalog ordering, bank-by-cable, educational test scoring, etc.

The concepts of the invention are useful in communications systems other than video. For example, multiplexed voice (telephone) or digital data is transmitted serially at very high bit rates via microwave or fiber optic transmission channels. This data is similar in format to the serial video data in line 2 or line 106 in FIG. 7. Accordingly, the memory device 5 as described above is very useful in processing this type of data. The data is written into the memory 5 from the communations link by the serial, sequentially-addressed (auto incrementing) port, and/or read from the memory 5 to the communications link by this port. That is, the memory 5 and microcomputer 8 can be part of a receiver, a transmitter, a realy station, or a transceiver. Once in the array 10 of the memory 5, the data is accessed in parallel in random fashion by the microcomputer 8 for utilization by D-to-A or A-to-D converters for telephone systems, by error detection and correction algorithms, demultilexing or multiplexing various channels, station-select, encrypting or decoding, conversion to formats for local area networks, and the like.

Another use of the concepts of the invention is in a mircocomputer system employing a magnetic disc for bulk storage. For example, the so-called Winchester disc provides several megabytes of storage which is accessed serially at bit rates of many megabits/second, similar to the video data rates of FIG. 7. Programs can be down-loaded from disc to memory 5 in large blocks of 64K-bytes or 128K-bytes, then the microcomputer executes from the memory 5 until a given task is completed or interrupted. The contents of memory 5 can be read out and sent to the disc storage via line 2 while another block is being written into memory via input 22.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A data processing system comprising:

bus means for communicating data signals, address signals, and control signals;

microprocessor means for processing data, said microprocessor means connected to said bus means;

a first clocking means for providing clock pulses at its output;

a second clocking means for providing clock pulses at its output;

a first and a second dual-port memory, said first and said second dual-port memory each comprising:

an array of memory cells;

addressing means coupled to said bus means for addressing the memory cell in said array corresponding to an address signal on said bus means;

a random access port coupled ot said means and to said array of memory cells, for communicating data from said microprocessor means to the addressed memory cell, and from said addressed memory cell to said microprocessor means;

a register;

means for transferring the contents of a plurality of memory cells of said array into said register; and a serial output port, coupled to said register and to said first clocking means so that the contents of said register is serially presented responsive to a series of clock pulses, independently from said microprocessor means addressing, and communicating data to and from, memory cells in said array;

utilization means for receiving data stored by said first and second dual-port memories, said utilization means having a serial input; and a serial register, having a first parallel input connected to said serial output port of said first dual-port memory, having a second parallel input connected to said serial output port of said second dual-port memory, and having an output connected to said serial input of said utilization means so that, responsive to a series of clock pulses provided by said second clocking means, the serial data presented by said serial output ports of said first and second memory means are serially presented to said serial input of said utilization means.

2. A system according to claim 1, wherein said microprocessor means is contained within a single-chip integrated circuit.

3. A system according to claim 1, wherein said first clocking means comprises:

a frequency divider having an input connected to the output of said second clocking means, and having an output, operative in such a manner that the output of said frequency divider provides a clock pulse upon a preselected multiple of clock pulses provided by said second clocking means.

4. A system according to claim 3, wherein said first an said second dual-port memory each further comprise: a serial input port, connected to said register, for receiving serial input data;

and wherein said tranferring means is also for transferring the contents of said register into a plurality of memory cells in said array.

5. A system according to claim 4, further comprising means for storing serial data, connected to said serial input ports of said first and said second dual-port memories, so that serial input data may be input to said first and said second dual-port memories for storage in the arrays of said first and second dual-port memories.

6. A system according to claim 1, wherein said memory cells in said arrays in each of said first and said second dual-port memories are arranged in rows and columns;

wherein said addressing means in each of said first and said second dual-port memories utilizes a portion of the address signal communicated to it by said microprocessor means as a row address, and a portion of said address signal as a column address;

and wherein said transferring means in each of said first and said second dual-port memories transfers the contents of memory cells contained in the row corresponding to said row address portion of said address signal into said register.

7. A system according to claim 6, wherein said first and said second dual-port memories each further comprise:

transfer control means, responsive to a control signal provided by said microprocessor means via said bus means, for selectively enabling and disabling said transferring means of said first and said second dual-port memories.

8. A system according to claim 1, wherein said first and said second dual-port memories each further comprise:

select means, responsive to a control signal from said microprocessor means via said bus means, for selectively enabling or disabling said serial output port;

and further comprising:

a third dual-port memory and a fourth dual-port memory, said third and said fourth dual-port memories each comprising:

an array of memory cells;

addressing means coupled to said bus means for addressing the memory cell in said array corresponding to an address signal on said bus means;

a random access port coupled to said bus means and to said array of memory cells for communicating data from said microprocessor means to the addressed memory cell, and from said addressed memory cell to said microprocessor means;

a register;

means for transferring the contents of memory cells contained in the row of said array corresponding to said row address into said register;

a serial output port, coupled to said register and to said first clocking means so that the contents of said register is serially presented responsive to a series of clock pulses, independently from said microprocessor means addressing, and communicating data to and from, memory cells in said array; and select means, responsive to a control signal from said microprocessor means via said bus means, for selectively enabling or disabling said serial outpout port;

wherein said first parallel input of said serial register is connected to said serial output ports of both said first dual-port memory and said third dual-port memory, and wherein said second parallel input of said serial register is connected to said serial output ports of both said second dual-port memory and said fourth dual-port memory;

and wherein said microprocessor means provides said control signals to said dual-port memories in such a manner that at most one of said serial output ports of said first and said third dual-port memories is enabled at any time, and that at most one of said serial outputs ports of said second and said fourth dual-port memories is enabled at any time.

9. A system according to claim 1, wherein said bus means comprises a plurality of conductive interconnections;

and wherein said address signals and said data signals are multiplexed on a conductive interconnection.

10. A data processing system comprising:

bus means for communicating data signals, address signal, and control signals;

microprocessor means for processing data, said microprocessor means connected to said bus means;

a first clocking means for providing clock pulses at its output;

a frequency divider having an input connected to the output of said first clocking means, and having an output, operative in such a manner that the output of said frequency divider provides a clock pulse upon a preselected multiple of clock pulses provided by said first clocking means, said preselected multiple equalling the number of dual-port memories;

a plurality of dual-port memories, each of said dual-port memories comprising:

an array of memory cells;

addressing means coupled to said bus means for addressing the memory cell in said array corresponding to an address signal on said bus means;

a random access port coupled to said bus means and to said array of memory cells for communicating data from said microprocessor means to the addressed memory cell, and from said addressed memory cell to said microprocessor means;

a register;

means for transferring the contents of a plurality of memory cells of said array into said register; and a serial output port, coupled to said register and to said frequency divider so that responsive to a series of clock pulses provided by said frequency divider the contents of said register is serially presented independently from said microprocessor means addressing, and communicating data to and from, memory cells in said array;

utilization means for receiving data stored by said plurality of memories said utilization means having a serial input;

a serial register, having a plurality of inputs, each input connected to a serial output port of one of said said plurality of dual-port memories, and having an output connected to said serial input of said utilization means so that, responsive to a series of clock pulses provided by said clocking means, the serial data presented by said serial output ports of said plurality of dual-port memories is serially presented to said serial input of of said utilization means;

wherein said preselected multiple in said frequency divider is equal to the number of inputs of said serial register.

11. A system according to claim 10, wherein said bus means comprises a plurality of conductive interconnections;

and wherein said address signals and said data signals are multiplexed on a conductive interconnection.

12. A data processing system comprising:

bus means for communicating data signals, address signals, and control signals;

microprocessor means for processing data, said microprocessor means connected to said bus means;

a clocking means for providing clock pulses at its output;

a dual-port memory comprising:

an array of memory cells arranged in rows and columns;

addressing means coupled to said bus means for addressing the memory cell in said array corresponding to an address signal on said bus means, said addresing means utilizing a portion of said address signal as a row address, and utilizing a portion of said address signal as a column address;

a random access port coupled to said bus means and to said array of memory cells for communicating data from said microprocessor means to the addressed memory cell, and from said addressed memory cell to said microprocessor means;

a register of memory cells;

means for transferring the contents of a plurality of memory cells of said array into said register;

a serial output port, coupled to said register and to said clocking means so that, responsive to a series of clock pulses, the contents of a series of said memory cells in said register are presented by said serial output port independently from said microprocessor means addressing, and communicating data to and from, memory cells in said array;

a counter, connected to said addressing means, said counter adapted to store a row address, said addressing means responsive to said row address stored in said counter; and means, connected to said counter, for receiving a increment signal, said counter incrementing the row address stored therein responsive to said increment signal; and utilization means for receiving data stored by said dual-port memory, said utilization means having a serial input connected to the serial output port of said dual-port memory.

13. A system according to claim 12, further comprising means, coupled to said clocking means, for generating said increment signal responsive to a predetermined number of said clock pulses generated by said clocking means.

14. A system according to claim 12, wherein said dual-port memory further comprises:

a timer;

means, coupled to said timer, for generating said increment signal so that said counter is incremented responsive to said timer reaching a predetermined timer interval.

* * * * *